(12) United States Patent
Lin et al.

(10) Patent No.: US 12,362,307 B2
(45) Date of Patent: Jul. 15, 2025

(54) SEMICONDUCTOR PACKAGE WITH BALL GRID ARRAY CONNECTION HAVING IMPROVED RELIABILITY

(71) Applicant: Taiwan Semiconductor Manufacturing Company, Hsinchu (TW)

(72) Inventors: Yu-Sheng Lin, Zhubei (TW); Chen-Nan Chiu, Hsinchu (TW); Jyun-Lin Wu, Hsinchu (TW); Yao-Chun Chuang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 506 days.

(21) Appl. No.: 17/898,777

(22) Filed: Aug. 30, 2022

(65) Prior Publication Data

US 2024/0071974 A1 Feb. 29, 2024

(51) Int. Cl.
*H01L 23/00* (2006.01)
*H01L 21/48* (2006.01)
(Continued)

(52) U.S. Cl.
CPC .......... *H01L 24/17* (2013.01); *H01L 21/4882* (2013.01); *H01L 23/3675* (2013.01);
(Continued)

(58) Field of Classification Search
CPC . H01L 24/17; H01L 21/4882; H01L 23/3675; H01L 24/05; H01L 24/06; H01L 24/16; H01L 24/32; H01L 24/73; H01L 24/81; H01L 25/0655; H01L 2224/05547; H01L 2224/05551; H01L 2224/05555; H01L 2224/0603; H01L 2224/06051; H01L 2224/06179; H01L 2224/16014;
(Continued)

(56) References Cited

U.S. PATENT DOCUMENTS 10,367,415 B1 * 7/2019 Sturcken ................. H01F 27/24
10,866,376 B1 * 12/2020 Ghiasi .................. G02B 6/4292
(Continued)

FOREIGN PATENT DOCUMENTS

TW 201906115 A 2/2019
TW 201926625 A 7/2019
(Continued)

*Primary Examiner* — Douglas W Owens
(74) *Attorney, Agent, or Firm* — Lippes Mathias LLP (57) ABSTRACT

A semiconductor package includes a substrate and at least one integrated circuit (IC) die. Substrate solder resist has substrate solder resist openings exposing substrate bonding pads of the bonding surface of the substrate, and die solder resist has aligned die solder resist openings exposing die bonding pads of the bonding surface of the IC die. A ball grid array (BGA) electrically connects the die bonding pads with substrate bonding pads via the die solder resist openings and the substrate solder resist openings. The die solder resist openings include a subset A of the die solder resist openings in a region A of the bonding surface of the IC die and a subset B of the die solder resist openings in a region B of the bonding surface of the IC die. The die solder resist openings of subset A are larger than those of subset B.

20 Claims, 8 Drawing Sheets

(51) Int. Cl.
  *H01L 23/367*  (2006.01)
  *H01L 25/065*  (2023.01)
(52) U.S. Cl.
  CPC .............. *H01L 24/05* (2013.01); *H01L 24/06* (2013.01); *H01L 24/16* (2013.01); *H01L 24/32* (2013.01); *H01L 24/73* (2013.01); *H01L 24/81* (2013.01); *H01L 25/0655* (2013.01); *H01L 2224/05547* (2013.01); *H01L 2224/05551* (2013.01); *H01L 2224/05555* (2013.01); *H01L 2224/0603* (2013.01); *H01L 2224/06051* (2013.01); *H01L 2224/06179* (2013.01); *H01L 2224/16014* (2013.01); *H01L 2224/16055* (2013.01); *H01L 2224/16059* (2013.01); *H01L 2224/16227* (2013.01); *H01L 2224/1703* (2013.01); *H01L 2224/17055* (2013.01); *H01L 2224/17179* (2013.01); *H01L 2224/32225* (2013.01); *H01L 2224/32245* (2013.01); *H01L 2224/73204* (2013.01); *H01L 2224/73253* (2013.01); *H01L 2224/81375* (2013.01); *H01L 2224/81395* (2013.01); *H01L 2224/81815* (2013.01); *H01L 2924/1431* (2013.01); *H01L 2924/1436* (2013.01); *H01L 2924/16195* (2013.01); *H01L 2924/16235* (2013.01); *H01L 2924/16251* (2013.01); *H01L 2924/1631* (2013.01); *H01L 2924/1632* (2013.01); *H01L 2924/3511* (2013.01); *H01L 2924/3512* (2013.01)

(58) Field of Classification Search
  CPC . H01L 2224/16055; H01L 2224/16059; H01L 2224/16227; H01L 2224/1703; H01L 2224/17055; H01L 2224/17179; H01L 2224/32225; H01L 2224/32245; H01L 2224/73204; H01L 2224/73253; H01L 2224/81375; H01L 2224/81395; H01L 2224/81815; H01L 2924/1431; H01L 2924/1436; H01L 2924/16195; H01L 2924/16235; H01L 2924/16251; H01L 2924/1631; H01L 2924/1632; H01L 2924/3511; H01L 2924/3512; H01L 23/053; H01L 25/50; H01L 23/10; H01L 23/42; H01L 23/3736; H01L 23/49816; H01L 23/5383; H01L 23/562; H01L 23/36; H01L 24/13; H01L 24/14; H01L 24/83; H01L 24/92; H01L 25/18
  See application file for complete search history.

(56) References Cited

U.S. PATENT DOCUMENTS

| | | | |
|---|---|---|---|
| 2009/0212443 A1* | 8/2009 | Zhong | H01L 23/5382 |
| | | | 257/E21.511 |
| 2011/0001230 A1* | 1/2011 | Li | H01L 23/49838 |
| | | | 257/693 |
| 2013/0175686 A1* | 7/2013 | Meyer | H01L 24/17 |
| | | | 257/737 |
| 2016/0329293 A1* | 11/2016 | Cha | H01L 24/13 |
| 2022/0157705 A1* | 5/2022 | Yin | H01L 21/4846 |
| 2024/0047325 A1* | 2/2024 | Lo | H05K 1/114 |
| 2024/0071998 A1* | 2/2024 | Huang | H01L 24/73 |

FOREIGN PATENT DOCUMENTS

| | | |
|---|---|---|
| TW | 202101728 A | 1/2021 |
| TW | 202129885 A | 8/2021 |

* cited by examiner

SEMICONDUCTOR PACKAGE WITH BALL GRID ARRAY CONNECTION HAVING IMPROVED RELIABILITY

BACKGROUND

The following relates to the semiconductor packaging arts, integrated circuit (IC) die mounting arts, and related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A wide range of semiconductor packages employ ball grid arrays (BGAs) for connecting an integrated circuit (IC) die with a substrate. The ball grid array comprises a set of electrically conductive bonding bumps to electrically connect the IC die with the substrate. The electrically conductive bonding bumps are also sometimes referred to in the art as "bonding balls" since they sometimes are supplied as spherical balls of solder or another electrically conductive material—however, the electrically conductive bonding bumps are not necessarily spherical, especially after reflow or other processing to establish the bond between the IC die and the substrate. In one nonlimiting illustrative example, one or more dynamic random access memory (DRAM) dies (or chips) and one or more logic IC dies may be mounted to a common substrate to provide a computing system with logic and memory in a compact and high speed package. The substrate may for example be a silicon substrate with through-silicon vias (TSV's), one or more redistribution layers (RDL's) providing integral fan-out (InFO) or the like, so as to form a surface-mount semiconductor package including the DRAMs and logic die(s). To complete the package, in some designs a lid is placed atop the dies after bonding the dies to the substrate. This can entail a peripheral ring to support the lid, and thermal paste or other thermal interface material is typically placed atop the dies prior to installing the lid. The thermal interface material enhances cooling of the completed package.

However, BGAs can suffer from various reliability problems. One problem that can arise is that the electrically conductive bonding bumps of the BGA which form the bonds between the IC die and the substrate can crack or break, leading to higher-than-expected electrical resistance, or a complete loss of electrical connectivity, between the IC die and the substrate at that bonding bump. As used herein, bonding bump cracking or breakage is to be understood as also encompassing two similar failure modes: degradation of severing of the bond between the electrically conductive bonding bump and the bonding pad of the IC die; and degradation or severing of the bond between the electrically conductive bonding bump and the bonding pad of the substrate. Such failure modes can be instigated at various points in the packaging process, such as during the initial reflow process used to reflow the BGA balls to form the electrically conductive bonding bumps, or during thermal cycling after that thermal reflow process, or during board-level reliability (BLR) testing (e.g., during a drop BLR test), or so forth. Various mechanisms can produce bonding bump cracking, such as thermal mismatch-induced stress during thermal cycling, or physical impact of the semiconductor package due to mishandling of the semiconductor package or during intentional impact testing such as a drop BLR test.

As recognized herein, bonding bump cracking is more likely to occur for electrically conductive bonding bumps at the corners or other peripheral regions of a semiconductor package. This is because the peripheral regions often experience higher levels of stress in response to applied force such as installing a lid, for example. Additionally, the peripheral regions are more prone to sustaining the brunt of any inadvertent impact that the semiconductor package suffers. Still further, misalignment or inconsistency in the placement of the bonding bumps of the BGA or the underlying structure such as the solder resist openings is likely to produce the largest adverse effect at the periphery since during pick-and-placement of the IC die on the substrate the placement is likely to optimize positioning of the central portion of the IC die, possibly at the expense of greater misalignment of the periphery of the IC die. Yet another source of ball bond cracking is thermal mismatch during thermal expansion leading to warping or bowing of the IC die and/or warping or bowing of the substrate. This can occur, for example, if the IC die or substrate is made up of multiple layers of different materials with different coefficients of thermal expansion. The different amounts of thermal expansion of the different layers can lead to warping or bowing of the IC die or substrate, and such warping or bowing will often introduce the largest amount of stress at the periphery of the IC die/substrate bond area. For example, if the layers closest to the IC die/substrate interface have larger coefficient of thermal expansion than the layers further away from that interface, then this can induce warping or bowing under differential thermal expansion that can cause the corners of a rectangular IC die to pull away from the substrate. As another example, if the IC die as a whole has a different coefficient of thermal expansion than the substrate, then during heating the overall size of the IC die will increase due to thermal expansion at a different rate than the substrate, which again will produce the largest mismatch at the periphery of the IC die.

Various approaches can be used to reduce likelihood of bonding bump cracking. However, these approaches may entail modifications in the processing, such as limiting high temperature processing steps after the BGA is reflowed, or using specialized materials for the bonding bumps. Such approaches can adversely impact the semiconductor packaging workflow, and/or add cost to the packing process.

Embodiments disclosed herein reduce likelihood of bonding bump cracking without such concomitant disadvantages. These embodiments leverage the recognition herein that bonding bump cracking is more likely to occur for bonding bumps at the corners or other peripheral regions of a semiconductor package. The disclosed approaches modify the solder resist openings to make the openings larger in the peripheral region of the IC die bonding surface. (It is noted that this peripheral region may comprise multiple sub-regions, e.g. two corners of a rectangular die). This has a number of beneficial effects that can operate to reduce likelihood of bonding bump cracking. One effect is that the larger solder resist openings at the periphery can accommodate misalignment between the solder resist openings of the IC die and corresponding solder resist openings of the substrate, whether such misalignment is due to imperfections in the definition of the solder resist openings or arises due to differential thermal expansion during thermal processing performed after the reflow process. Another effect is that the larger solder resist openings in the periphery accommodate a greater fraction of the reflowed solder bumps, which changes the shape of the reflowed solder bump to be wider and hence more robust against solder bump cracking.

Another approach might appear to be to enlarge the solder resist openings of the IC die over the entire bonding surface of the IC die. However, this results in a reduced total number of solder resist openings, and consequently a reduced number of bonding bumps in the BGA, for a given IC die size. By contrast, the approaches disclosed herein enlarge the die solder resist openings only in the periphery. While this will still reduce the total number of bonding bumps in the BGA for a given IC die size, that reduction is less than would occur if all the solder resist openings are enlarged. Additionally, the impact of this modification may be mitigated by optimization of the design of the metallization layers of the IC die and/or the RDL of the substrate (if any), so that small critical dimension bonding pads can be located in the central region of the IC die where the sizes of the IC die solder resist openings are not enlarged.

Figure 1:
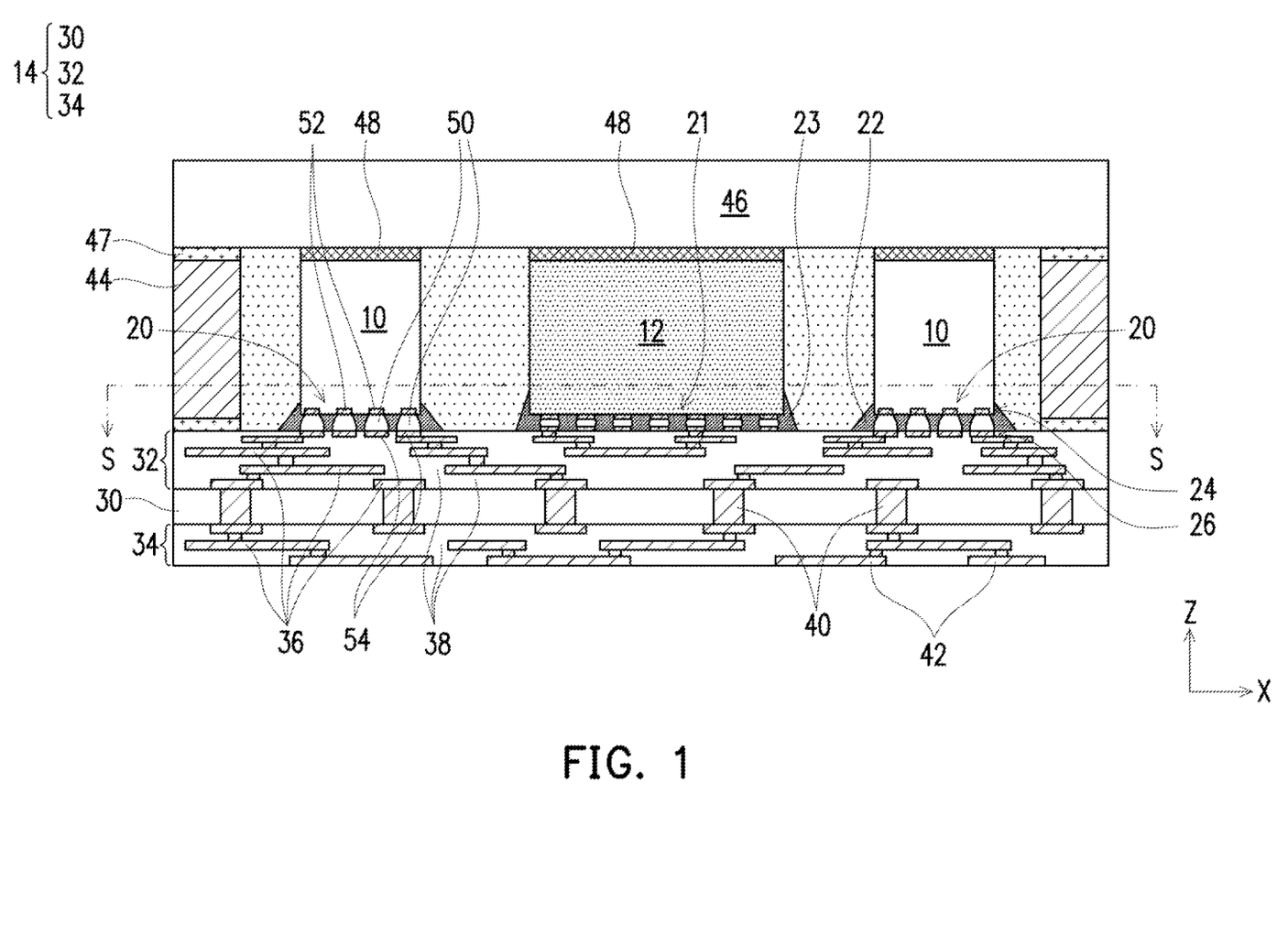
FIG. 1 diagrammatically illustrates a side sectional view of a semiconductor package including dynamic random access memory (DRAM) dies and a system on a chip (SoC) die.
Figure 2:
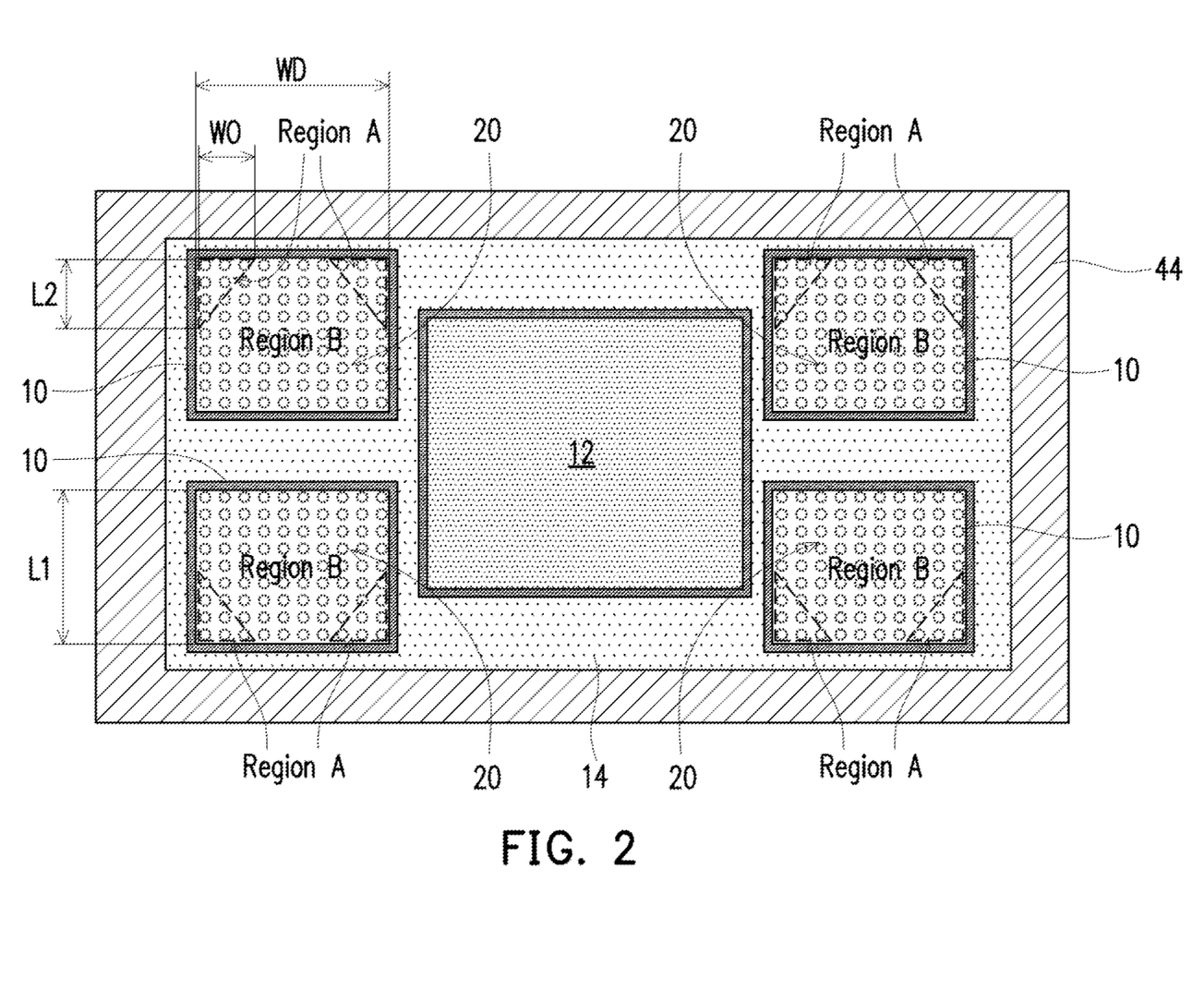
FIG. 2 diagrammatically illustrates Section S-S indicated in FIG. 1 according to one embodiment.

With reference to FIGS. 1 and 2, an illustrative semiconductor package is shown as a side sectional view (FIG. 1) and by way of a Section S-S indicated in FIG. 1 and shown in FIG. 2. The illustrative semiconductor package includes integrated circuit (IC) dies 10 in the form of at least one dynamic random access memory (DRAM) 10 (specifically four DRAM's 10 as seen in FIG. 2), which surround a centrally located logic IC die 12 such as a system-on-a-chip (SoC) die 12. The four DRAMs 10 are mounted on a substrate 14 by four respective ball grid arrays (BGAs) 20, and likewise the IC logic die 12 is mounted on the substrate 14 by a logic die BGA 21. Each BGA 20 and 21 is indicated diagrammatically in FIG. 1 with a few representative electrically conductive bonding bumps, while FIG. 2 illustrates a few representative electrically conductive bonding bumps only for the BGAs 20 electrically connecting the DRAMs 10. It should be noted that while FIG. 2 illustrates each BGA 20 with the representative bonding bumps arranged in a regular two-dimensional grid, each BGA 20 can have any arrangement of bonding bumps as appropriate for the layout of bonding pads on the DRAMs 10 and substrate 14, for example the layout of bonding bumps in a BGA 20 may or may not form a regular two-dimensional grid. As further diagrammatically shown in FIG. 1, each BGA 20 connecting a DRAM 10 has underfill material 22 disposed around the bonding bumps of the BGA 20; and likewise, the BGA 21 connecting the logic IC die 12 has underfill material 23 disposed around the bonding bumps of the BGA 21. (FIG. 2 does not illustrate the underfill material). The underfill material 22 and 23 may, by way of nonlimiting illustrative example, comprise an epoxy material.

More particularly, and with particular reference to FIG. 1 and focusing on the BGAs 20 electrically connecting the DRAMs 10 and the substrate 14, the IC die 10 (e.g. illustrative DRAM 10) has a bonding surface 24 facing a bonding surface 26 of the substrate 14. The bonding bumps of the BGA 20 electrically connect the IC die 10 and the substrate 14. More particularly, the bonding bumps of the BGA 20 electrically connect die bonding pads (not shown) of bonding surface 24 of the IC die 10 with substrate bonding pads (not shown) of the substrate 14. The details of these connections will be illustrated and described in further detail with reference to FIGS. 3 and 4. It is noted that while the illustrative bonding surface 24 of the IC die 10 and the facing bonding surface 26 of the substrate 14 are both planar surfaces, this is not necessarily the case. For example, one or both of these bonding surfaces 24 and/or 26 may be nonplanar, e.g. may include a step or other level change so that the various IC dies 10 and 12 may be at different levels, for example.

The bonding bumps of the BGAs 20 and 21 provide electrical interconnections between bonding pads (not shown in FIGS. 1 and 2, but see FIGS. 3 and 4) of the respective of the respective IC die 10 or 12 and the substrate 14. In the illustrative embodiment, the substrate 14 includes a core 30, which may for example comprise a silicon substrate, having diagrammatically indicated redistribution layers (RDLs) 32 and 34 on opposite sides of the core 30. Each RDL 32 and 34 comprises a plurality of patterned metallization layers 36 spaced apart by intermetal dielectric (IMD) material 38 and electrically interconnected by electrically conductive vias passing through the IMD material 38. Through-silicon vias (TSVs) 40 pass through the silicon core 30 to electrically interconnect the two RDLs 32 and 34. The RDLs 32 and 34 and TSVs 40 provide electrical pathways for transferring electrical power and/or signals between the BGAs 20 and 21 and bottom solder pads 42 of the substrate 14. The RDLs 32 and 34 may provide various benefits such as providing integral fan-out (InFO) for the electrical interconnects so as to spread the spacing of the solder pads 42 to facilitate easier soldering of the illustrative surface mount semiconductor package to a printed circuit board (PCB) or other mounting surface. It is to be understood that this is merely one nonlimiting illustrative arrangement, and that more generally the substrate 14 may or may not include RDL(s), TSVs, or so forth.

With continuing reference to FIGS. 1 and 2, the illustrative semiconductor package further includes a sealing ring 44 and a lid 46. These components 44 and 46, along with the substrate 14, form an enclosure that encloses the IC dies 10 and 12 to protect them from ingress of environmental contaminants and to structurally shield the IC dies 10 and 12 from external impacts or the like. As seen in FIG. 2, the sealing ring 44 encircles the IC dies 10 and 12, and the lid 46 is disposed on the ring 44 and on the IC dies 10 and 12. The ring 44 may, for example, comprise a metal material, and the lid 46 may be secured on the substrate 14 and on the ring 44 by an adhesive 47.

In the illustrative embodiment, the lid 46 serves as a heat spreading and/or heatsinking component for the IC dies 10 and 12. To this end, the lid 46 may comprise a thermally conductive material such as steel, stainless steel, copper, nickel, cobalt, various alloys thereof, or a composite such as silicon carbide, aluminum nitride, graphite, or so forth, and a thermal interface material 48 is disposed between the lid 46 and each IC die 10 and 12 to promote heat transfer from the IC dies 10 and 12 to the thermally conductive lid 46. The thermal interface material 48 may, by way of nonlimiting illustrative example, comprise a silicone material, optionally mixed with particles of alumina ($Al_2O_3$), zinc oxide ($ZnO_2$), or the like. To further promote the heat spreading and/or heatsinking performance of the lid 46, the ring 44 may comprise a thermally conductive material such as copper, steel, stainless steel, or another a metal material, and the adhesive 47 may be thermally conductive (and in some embodiments may comprise the same material as the thermally interface material 48 disposed between the lid 46 and the ID dies 10 and 12).

Although not shown, in some embodiments the substrate 14 and the lid 46 may extend across multiple instances of the substrate package shown in FIG. 1, or across the substrate package shown in FIG. 1 and across other substrate packages that are disposed on the substrate 14 with the IC dies of such packages interposed between the substrate 14 and the lid 46.

The BGAs 20 electrically connecting the DRAMs 10 to the substrate 14 are the focus of the further discussion below. With particular reference to FIG. 1, each BGA 20 includes electrically conductive bonding bumps 50, of which only a few representative electrically conductive bonding bumps 50 are shown in FIG. 1. Each bonding bump 50 comprises an electrically conductive material such as solder, a copper-core bonding bump comprising a core of copper coated with solder, or the like, which electrically connects a die bonding pad of the bonding surface 24 of the IC die 10 and a substrate bonding pad of the bonding surface 26 of the substrate 14.

With reference to FIG. 1, each bonding bump 50 of the BGA 20 is aligned a corresponding die solder resist opening 52 passing through a die solder resist that coats the bonding surface 24 of the IC die 10. Similarly, each bonding bump 50 of the BGA 20 is aligned a corresponding substrate solder resist opening 54 passing through a substrate solder resist that coats the bonding surface 26 of the substrate 14. As a consequence, the die solder resist opening 52 and substrate solder resist opening 54 aligned with each bonding bump 50 of the BGA 20 are also aligned with each other. By way of these solder resist openings 52 and 54, the electrically conductive bonding bumps 50 of the BGA 20 electrically connect die bonding pads of the bonding surface 24 of the IC die 10 and substrate bonding pads of the bonding surface 26 of the substrate 14.

With particular reference to FIG. 2, the bonding surface 24 of the DRAM die 10 is divided into a peripheral Region A of the bonding surface 24 of the DRAM die 10 and a remaining region B of the bonding surface 24 of the DRAM die 10. The bonding bumps 50 (labeled in FIG. 1 but not in FIG. 2) in the peripheral Region A form a subset A of the bonding bumps 50 of the BGA 20. The bonding bumps 50 in the Region B similarly form a subset B of the bonding bumps 50 of the BGA 20. As will be further described with reference to FIGS. 3 and 4, the die solder resist openings 52 aligned with the respective bonding bumps 50 of the subset A are larger than the die solder resist openings 52 aligned with the bonding bumps 50 of the subset B. That is, the die solder resist openings 52 formed in at least one peripheral region of the bonding surface 24 of the IC die 10 are larger than the other die solder resist openings 52 formed in the die solder resist. (In the example of FIG. 2, the aforementioned at least one peripheral region corresponds to the two sub-regions collectively making up Region A which are located at two corners of the rectangular DRAM 10).

While the illustrative IC dies 10 electrically connected with the substrate 14 by respective BGAs 20 are DRAMs 10, more generally this approach of employing a BGA with die solder resist openings 52 formed in at least one peripheral region of the bonding surface 24 of the IC die 10 being larger than the other die solder resist openings 52 formed in the die solder resist can be employed with any type of IC die. For example, the IC die 10 may more generally comprise an integrated circuit (IC) formed on a semiconductor substrate (e.g., silicon substrate, gallium arsenide substrate, or so forth), or the IC die 10 may be a sub-package made up of two or more constituent IC dies that are bonded together as a subassembly (either directly or via a silicon interposer or the like). It is further noted that he terms IC die and IC chip are used interchangeably herein, that is, the IC die 10 can alternatively be referred to as an IC chip 10.

Similarly, while the illustrative substrate 14 includes the core 30 with TSVs 40 and RDLs 32 and 34, more generally the substrate 14 may be a silicon substrate, a gallium arsenide substrate, or a substrate of another material, and may or may not include one or more RDLs, may or may not include through-vias, and may or may not include printed circuit traces or the like on one or both principal surfaces of the substrate 14. It is also contemplated for the substrate 14 to be another IC die that serves as a host IC die for the IC die 10. Moreover, where (as in FIGS. 1 and 2) there are multiple IC dies 10 in the semiconductor package, these may all be the same type of IC die (e.g., all DRAMs 10 as shown) or may be various combinations of different IC dies. However, it is contemplated for the approach of employing a BGA with die solder resist openings 52 formed in at least one peripheral region of the bonding surface 24 of the IC die 10 that are larger than the other die solder resist openings 52 formed in the die solder resist to be applied in the case of as few as a single IC die 10 attached to the substrate 14.

Conversely, as shown in FIGS. 1 and 2 the semiconductor package may optionally include one or more additional IC dies (such as illustrative logic IC die 12) that do not employ the approach of employing a BGA with die solder resist openings 52 formed in at least one peripheral region of the bonding surface 24 of the IC die 10 being larger than the other die solder resist openings 52 formed in the die solder resist. (For example, the logic die BGA 21 of the semiconductor package of FIGS. 1 and 2 does not employ the approach in which die solder resist openings formed in at least one peripheral region of the bonding surface are larger than the other die solder resist openings).

Figure 3:
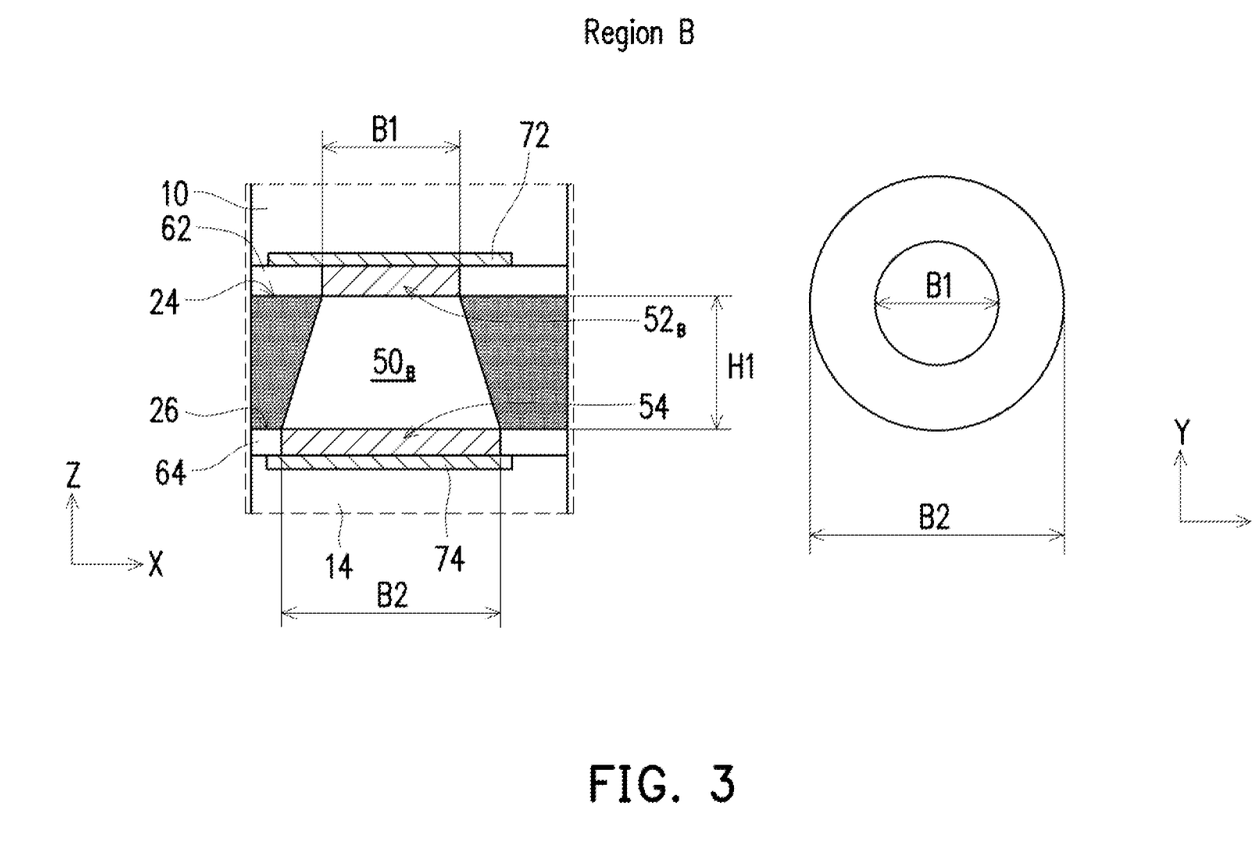
FIG. 3 diagrammatically illustrates one electrically conductive bonding bump between a DRAM and a substrate in the Region B area indicated in FIG. 2, including a side sectional view (left side of FIG. 3) and a top view (right side of FIG. 3).
Figure 4:
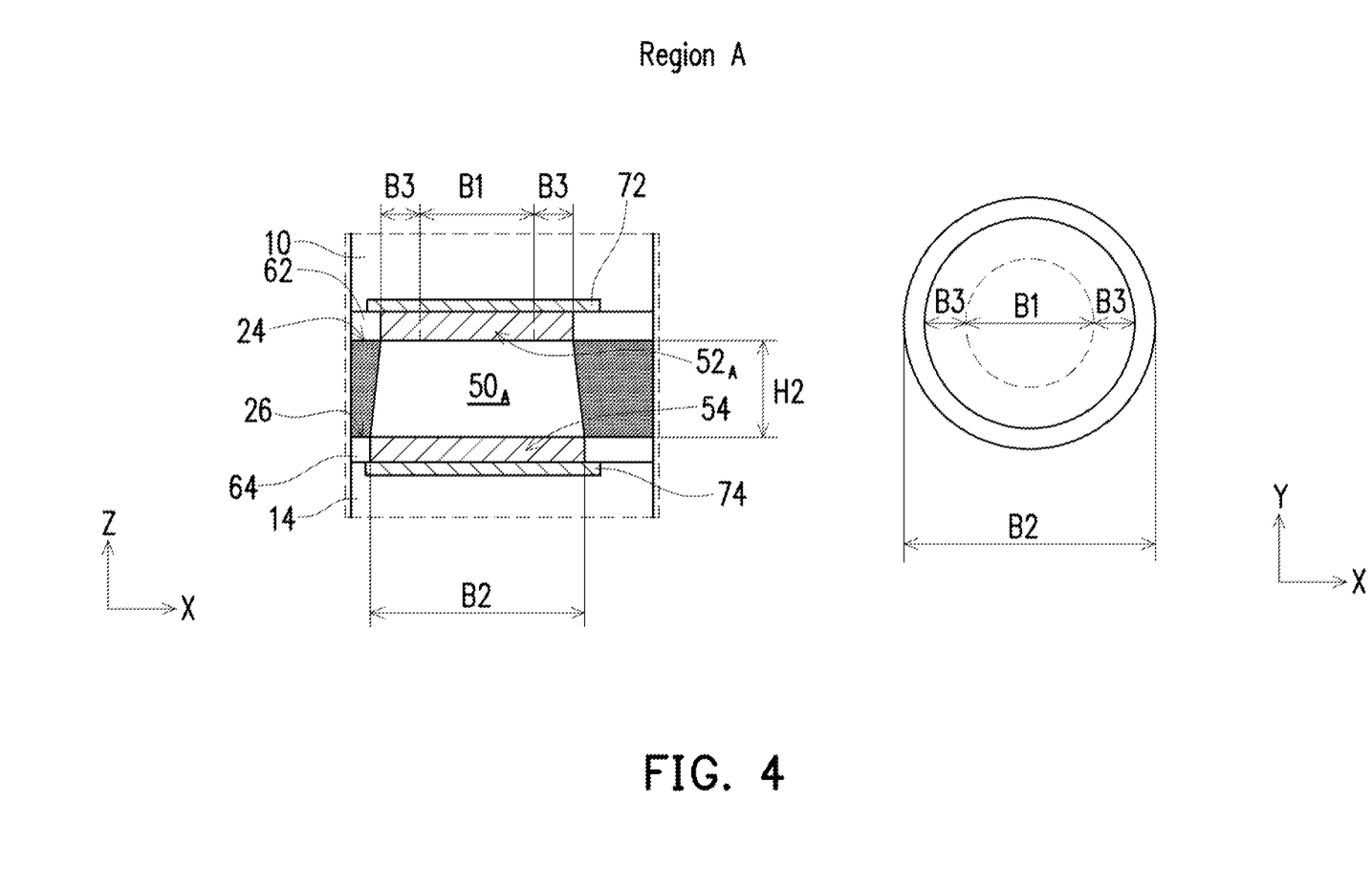
FIG. 4 diagrammatically illustrates one electrically conductive bonding bump between a DRAM and a substrate in one of the Region A areas indicated in FIG. 2, including a side sectional view (left side of FIG. 4) and a top view (right side of FIG. 4).

With reference now to FIGS. 3 and 4, illustrative examples of an electrically conductive bonding bump 50 in the Region B (FIG. 3) and in the Region A (FIG. 4) are diagrammatically shown. The left side of each of FIGS. 3 and 4 shows the relevant portion of the IC die 10 and substrate 14, the illustrative electrically conductive bonding bump (labeled in FIG. 3 as bonding bump $50_B$ to indicate a bonding bump of the subset B in region B, and in FIG. 4 as bonding bump $50_A$ to indicate a bonding bump of the subset A in region A), and the corresponding die solder resist opening $52_B$ (in FIG. 3) or $52_A$ (in FIG. 4) and corresponding substrate solder resist opening 54. Also indicated in the left side drawings of each of FIGS. 3 and 4 is the bonding surface 24 of the IC die 10, the bonding surface 26 of the substrate 14, the die solder resist 62 (through which the die solder resist openings $52_B$ or $52_A$ pass) and the substrate solder resist 64 (through which the substrate solder resist openings 54 pass). For example, if the die solder resist 62 is a die dielectric layer 62 then the die solder resist openings $52_B$ or $52_A$ are openings passing through the die dielectric layer 62; and likewise, if the substrate solder resist 64 is a substrate dielectric layer 64 then the substrate solder resist openings 54 are openings passing through the substrate dielectric layer 64. The die solder resist 62 may also be referred to as a die solder mask 62, and similarly the substrate solder resist 64 may be referred to as a substrate solder mask 64. The die and substrate solder resists 62 and 64 are suitably made of electrically insulating material effective to ensure the solder or other material of the bonding bump $50_B$ or $50_A$ contacts only in the area defined by the respective die and substrate solder resist openings $52_B$ or $52_A$ and 54. By way of nonlimiting illustrative example, the die and substrate solder resists 62 and 64 may comprise a lacquer-like layer of polymer, an epoxy resin, or other dielectric layer.

Still further shown in each of FIGS. 3 and 4 is the die bonding pad 72 of the bonding surface 24 of the IC die 10 and the substrate bonding pad 74 of the bonding surface 26 of the substrate 14. As seen in FIG. 3, the bonding bump $50_B$ electrically connects the die bonding pad 72 with the substrate bonding pad 74 via the die solder resist opening $52_B$ and the substrate solder resist opening 54. As seen in FIG. 4, the bonding bump $50_A$ electrically connects the die bonding pad 72 with the substrate bonding pad 74 via the die solder resist opening $52_A$ and the substrate solder resist opening 54.

However, comparison of FIG. 3 and FIG. 4 illustrates that the electrically conductive bonding bump $50_B$ of the subset B of bonding bumps in the Region B (see FIG. 2) has a different shape than the electrically conductive bonding bump $50_A$ of the subset A of bonding bumps in the peripheral Region A. This is because the die solder resist opening $52_A$ of FIG. 4 for the peripheral Region A is larger than the die solder resist opening $52_B$ of FIG. 3 for the Region B.

With continuing reference to FIGS. 3 and 4 and now considering both the side sectional view shown on the left side and a top view shown on the right side, and without loss of generality, some relevant dimensions are indicated as follows: the die solder resist opening $52_B$ in the Region B (FIG. 3) has a diameter B1; the substrate resist opening 54 in both Region B (FIG. 3) and Region A (FIG. 4) has diameter B2; the die solder resist opening $52_A$ in the peripheral Region A (FIG. 3) has a larger diameter B1+2×B3; the electrically conductive solder bump $50_B$ in the Region B (FIG. 3) has a height H1; and the electrically conductive solder bump $50_A$ in the peripheral Region A (FIG. 4) has a height H2. The diameter B1+2×B3 of the die solder resist openings $52_A$ in the peripheral Region A is larger than the diameter B1 of the die solder resist openings $52_B$ in the Region B, i.e. (B1+2×B3)>B1.

In the illustrative embodiment shown in FIGS. 3 and 4, the diameter B1+2×B3 of the die solder resist openings $52_A$ in the peripheral Region A is smaller than the diameter B2 of the substrate solder die resist openings 54, i.e. (B1+2×B3)<B2. This also implies that the diameter B1 of the die solder resist openings $52_B$ in the Region B is smaller than the diameter B2 of the substrate solder die resist openings 54, i.e. B1<B2. Note that in both Region B and peripheral Region A, the reflow process ensures that the solder of the bonding bump $50_B$ or $50_A$ fills the die solder resist opening $52_B$ or $52_A$ and also fills the substrate solder resist opening 54. Since substrate solder resist opening 54 is larger than the die solder resist opening $52_B$ or $52_A$, this means the cross section of the bonding bump $50_B$ or $50_A$ has a generally trapezoidal shape as seen in FIGS. 3 and 4 with the diameter of the bonding bump $50_B$ or $50_A$ narrowing as it approaches the die solder resist opening $52_B$ or $52_A$. This produces a necking effect in which the bonding bump $50_B$ or $50_A$ is narrower at the end proximate to the bonding surface 24 of the IC die 10 compared with the end proximate to the bonding surface 26 of the substrate 14. Without being limited to any particular theory of operation, it is believed necking of the bonding bumps toward the IC die may provide improved stress management, and also improves precision in positioning of the connection of the bonding bumps to the IC die bonding pads. If bonding bump cracking occurs, it is most likely to occur in this narrower neck region, that is, near to the bonding surface 24 of the IC die 10.

However, because the diameter of the die solder resist openings $52_A$ in the peripheral Region A is larger than the diameter of the die solder resist openings $52_B$ in the Region B, i.e. (B1+2×B3)>B1, it follows that this necking effect is reduced for the bonding bumps $50_A$ of the subset A of bonding bumps in the peripheral Region A. This reduces the likelihood of bonding bump breakage in the peripheral Region A, thereby partially or wholly compensating for or offsetting the increased likelihood of bonding bump breakage in the peripheral regions due to effects previously described such as increased impact of differential thermal expansion at the periphery and that the periphery is likely to absorb the brunt of any impact force. Indeed, in some contemplated embodiments, the diameter B1+2×B3 of the die solder resist openings $52_A$ in the peripheral Region A is equal to the diameter B2 of the substrate solder resist openings 54, in which case the solder bumps $50_A$ in the Region A would exhibit no necking at all.

In some embodiments, a ratio of the diameter B1+2×B3 of the die solder resist openings $52_A$ in the peripheral Region A to the diameter B2 of the substrate solder resist openings 54 is at least 0.7, that is:

$$\frac{B1 + 2 \times B3}{B2} \geq 0.7 \quad (1)$$

The illustrative solder resist openings have circular perimeters. Using the relationship for a circle of area:

$$A = \pi r^2 = \pi \left(\frac{d}{2}\right)^2 = \frac{\pi}{4} d^2$$

(where r is the radius of the circle and d is its diameter and A is its area), Equation (1) can be written in terms of areas as:

$$\frac{A_{SRO-A}}{A_{SRO-SBT}} \geq 0.5 \quad (2)$$

where $A_{SRO-A}$ is the area of the die solder resist openings $52_A$ in the peripheral Region A and $A_{SRO-SBT}$ is the area of the substrate solder resist openings 54. Equation (2) expressed in terms of opening areas can be applied for embodiments in which the solder resist openings have non-circular perimeters, e.g. to rectangular, oval, or otherwise-shaped openings. Equations (1) and (2) quantitatively express some illustrative geometries that advantageously significantly reduce the necking effect of the bonding bumps $50_A$ of the subset A in the Region A to a point where bonding bump breakage is expected to be significantly reduced.

The larger size of the die solder resist openings $52_A$ in the peripheral Region A compared with the smaller size of the die solder resist openings $52_B$ in the Region B also impacts the height of the bonding bumps. The die solder resist openings $52_B$ in the peripheral Region B have a height H1 (see FIG. 3, e.g. H1 may be in a range of 50-200 microns in some nonlimiting illustrative embodiments although larger or smaller height is also contemplated), and the die solder resist openings $52_A$ in the peripheral Region A have a smaller height H2. That is, height H1 is larger than height H2. This is a consequence of the solder material of the bonding bumps filling the die and substrate solder resist openings during the reflow process. Since the area $A_{SRO-A}$ of the die solder resist openings $52_A$ in the peripheral Region A is larger than the area of the die solder resist openings $52_B$ in the Region B, more of the solder material fills into the larger die solder resist opening $52_A$, resulting in H2 being less than H1. This effect of reduced bonding bump height H2 can be of particular benefit in reducing bonding bump breakage at the periphery if a dominant mechanism of such breakage is warping or bowing of the IC die 12 and/or substrate 10 in a manner that tends to apply compressive force to the bonding bumps $52_A$ at the periphery of the IC die 12. In a variant embodiment, the height H2 can be similar or equal to the height H1. For example, this can be the case if the volume of solder (per bump) used in bonding through the die solder resist openings $54_A$ (e.g., the corner regions in the embodiment of FIG. 2) is slightly larger than the volume of solder used in bonding through the die solder resist openings $54_B$.

With reference back to FIG. 2, the effectiveness of the disclosed approach for partially or wholly compensating for or offsetting the increased likelihood of bonding bump breakage in the peripheral regions by increasing the size of the die solder resist openings $52_A$ in the peripheral Region A is also impacted by the size of the Region A. In the embodiment of FIG. 2, each IC die 10 has a length L1 and a width WD. In some nonlimiting illustrative embodiments, the width WD of the IC die 10 may be 5-40 mm although larger or smaller widths are also contemplated. Region A comprises two triangular sub-regions each having a length L2 along the same direction as the length L1 of the IC die 10, and a width WO along the same direction as the width WD of the IC die 10. In some embodiments:

$$\frac{L2}{L1} \geq 0.15 \quad (3)$$

where again L1 is the length of a side of the rectangular area of the bonding surface 24 of the IC die 12, and L2 is a length of the corner regions of the Region A (per the embodiment of FIG. 2) along the same side of the rectangular area of the bonding surface 24 of the IC die 12 as L1. Equation (3) quantitatively expresses some illustrative geometries in which the Region A is sufficiently large compared with the size of the IC die 12 to significantly reduce the stress in the peripheral Region A to a point where bonding bump breakage is expected to be significantly reduced.

In FIG. 2, the peripheral Region A of the bonding surface 24 of each IC die 10 includes two triangular sub-regions at two corners of the bonding surface 24. More particularly, when considering the layout of the semiconductor package as a whole, the triangular sub-regions include the outermost four corners of the four DRAMs 10, and also the inner corner of each DRAM 10 along the long side of length WD of the DRAM and along the long side of the semiconductor package as a whole. As explained previously, these corner regions are expected to be most prone to bonding bump cracking or breakage, and hence it is advantageous for the peripheral Region A to include these corner sub-regions. In general, the use of the larger diameter B1+2×B3 for the die solder resist openings $52_A$ in the Region A compared with the diameter B1 for the die solder resist openings $52_A$ for the rest of the bonding bumps means that fewer bonding bumps can be included in the Region A as compared with if the bonding bumps in Region A had the smaller diameter B1. Hence, there may be a tradeoff in selecting the extent and layout of the peripheral Region A between reducing likelihood of bonding bump breakage versus maximizing the number of bonding bumps. This can lead to different choices for the size and extent of the Region A, with previously presented Equation (3) providing one suitable guideline that may optionally be used in making this tradeoff.

Figure 5:
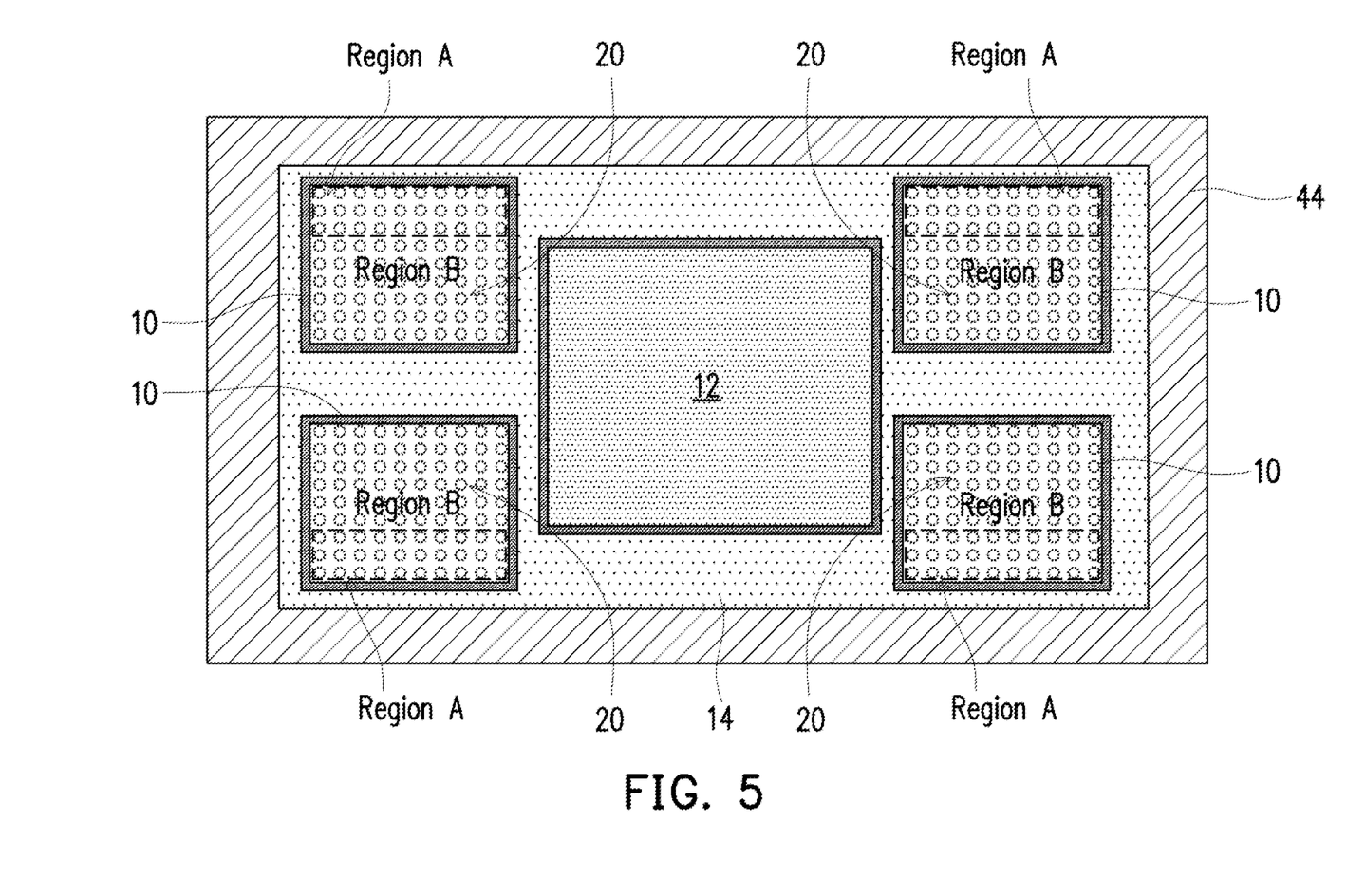
FIG. 5, FIG. 6, and FIG. 7 depict Section S-S indicated in FIG. 1 in accordance with additional embodiments in which the Region A areas have different spatial areas.
Figure 6:
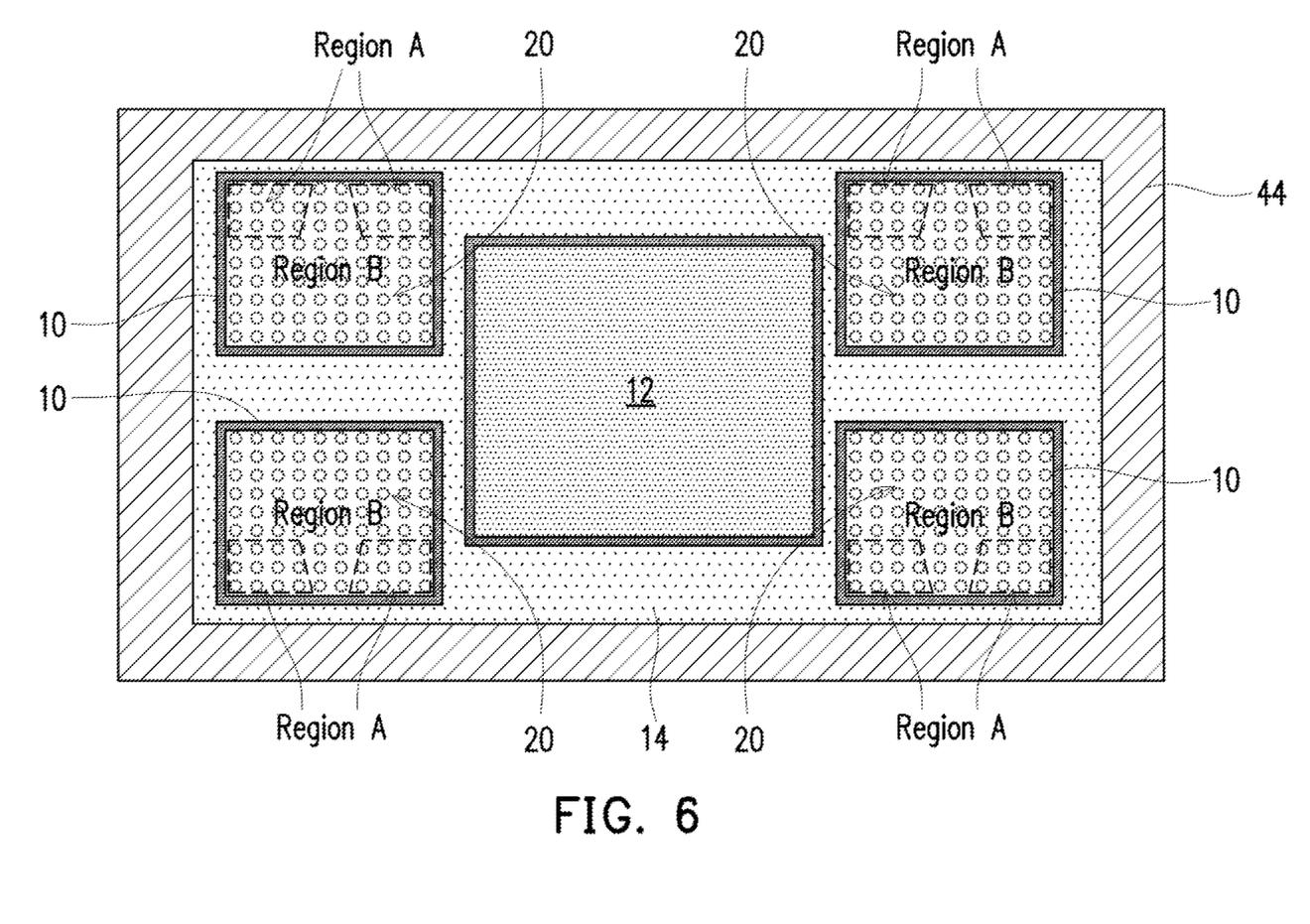
Figure 7:
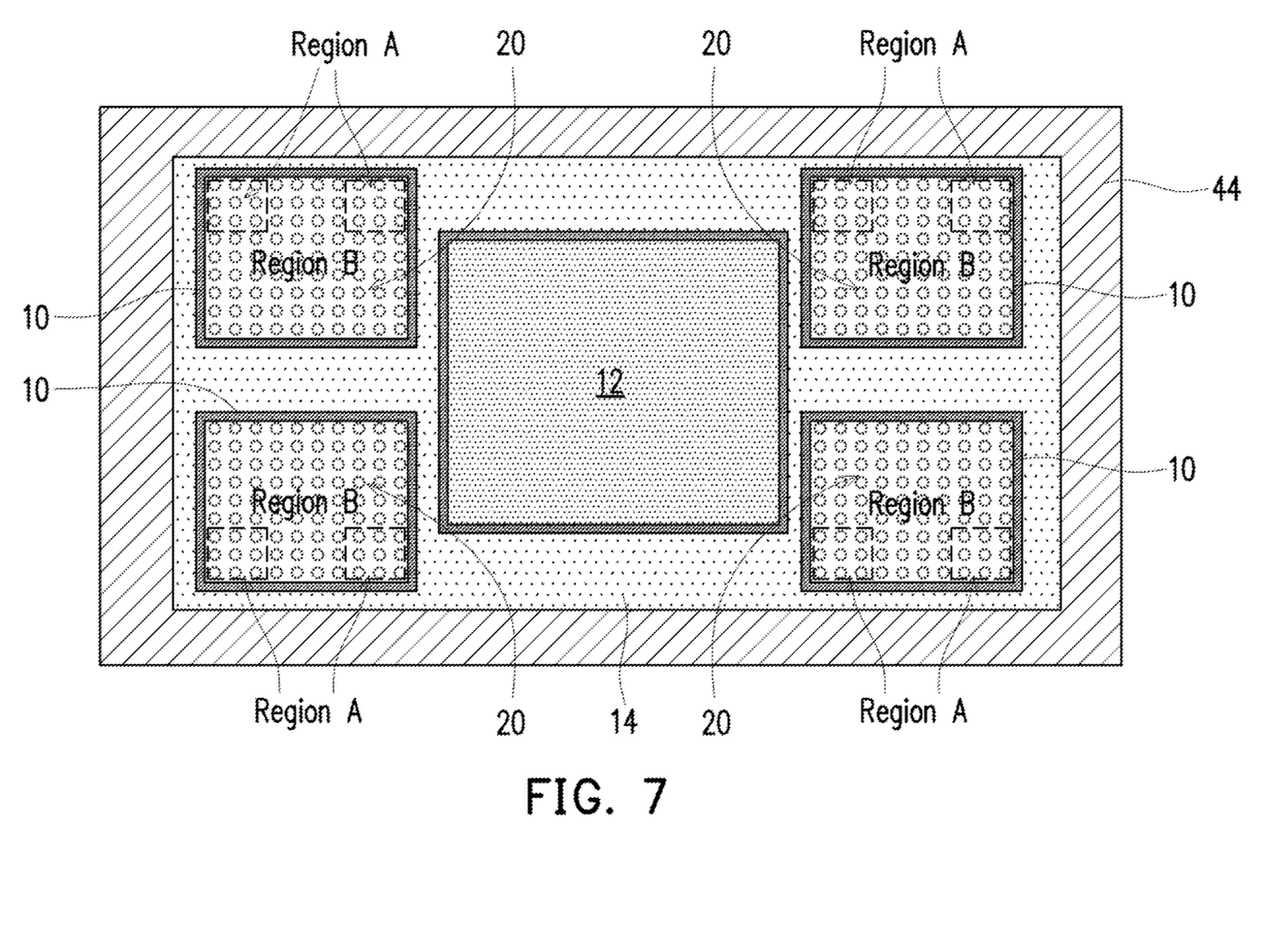

With reference to FIGS. 5, 6, and 7, other embodiments are shown by way of the Section S-S indicated in FIG. 1, which have different geometries for the peripheral Region A. In the embodiment of FIG. 5, peripheral Region A of the bonding surface of each IC die 10 is a single rectangular region that encompasses the area of the two triangular sub-regions making up peripheral Region A in the embodiment of FIG. 2 along with the area between those triangular regions.

In the embodiment of FIG. 6, peripheral Region A of the bonding surface of each IC die 10 includes two trapezoidal sub-regions positioned at the same two corners as the triangular sub-regions of peripheral Region A of the embodiment of FIG. 2.

In the embodiment of FIG. 7, peripheral Region A of the bonding surface of each IC die 10 includes two square or rectangular sub-regions positioned at the same two corners as the triangular sub-regions of peripheral Region A of the embodiment of FIG. 2.

It is to be appreciated that the embodiments of FIGS. 2 and 5-7 are nonlimiting illustrative examples, and that the extent and number of sub-regions making up the peripheral Region A can be various. In another contemplated variant, the IC die may be rectangular and the peripheral Region A may include four corner regions, one at each of the four corners of the rectangular IC die. In such an embodiment the four corner regions may have triangular, trapezoidal, rectangular or other shaping. In another contemplated variant, the IC die may be rectangular and the peripheral Region A may include three corner regions, two of which correspond to those shown in FIGS. 2 and 5-7 and the third being along the second side of the IC die that faces outward in the semiconductor package.

As a further contemplated variant, if thermal stress modeling and/or empirical testing and/or the like for a particular semiconductor package design indicate that the highest likelihood of bonding bump cracking is in a region of the bonding surface of the IC die other than a peripheral region, then the Region A whose die solder resist openings are designed to be larger may be chosen to be that non-peripheral region with highest likelihood of bonding bump cracking. As one illustrative example, if the bonding surface 26 of the substrate 14 is nonplanar with one or more steps placing the attached dies 10 and 12 at different heights, then it may be that the region with highest likelihood of bonding bump cracking may be proximate to a step. As another example, if the layers closest to the IC die/substrate interface have smaller coefficient of thermal expansion than the layers further away from that interface, then this can induce warping or bowing under differential thermal expansion that can cause the corners of a rectangular IC die to move toward the substrate and for the central region of the IC die to pull away from the substrate. In this case there central region may have a higher likelihood of bonding bump breakage leading to optimal design of Region A being a central region of the bonding surface of the IC die. These are merely further nonlimiting illustrative examples.

Figure 8:
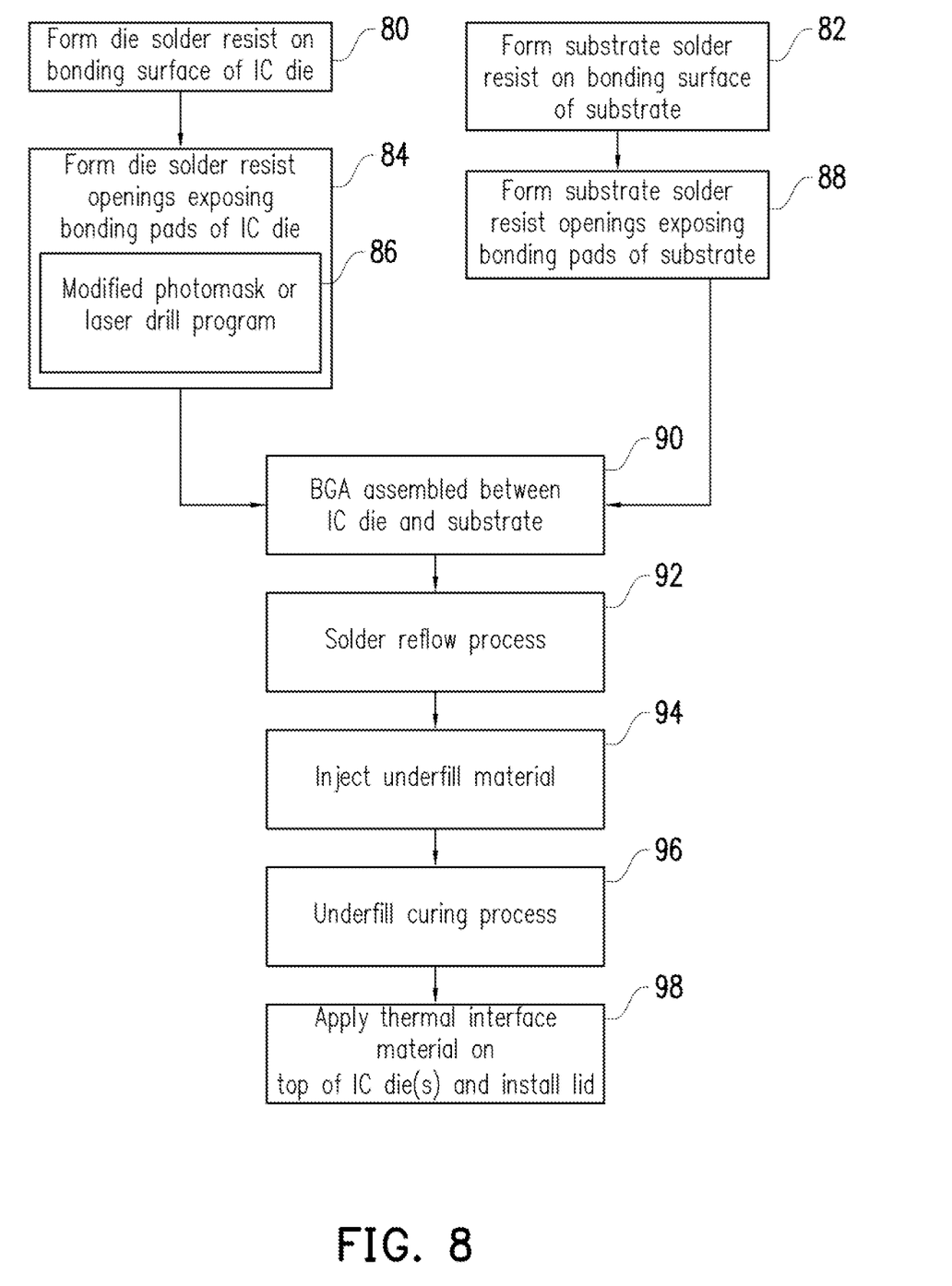
FIG. 8 illustrates by way of a flowchart a simplified method for assembling DRAM and SoC dies into the package of FIG. 1.

With reference to FIG. 8, an illustrative method of assembling the semiconductor package of FIGS. 1 and 2 (or of FIGS. 1 and 5, or of FIGS. 1 and 6, or of FIGS. 1 and 7) are shown. The method of FIG. 8 assumes that the IC dies 10 and 12 and the substrate 14 are already fabricated and ready to be packaged. In an operation 80, the die solder resist 62 is formed on the bonding surface 24 of the IC die 10. In an operation 82, the substrate solder resist 64 is formed on the bonding surface 26 of the substrate 14.

In an operation 84, the die solder resist openings $52_A$ and $52_B$ are formed in Region A and Region B, respectively, of the die solder resist 62. As previously described, these die solder resist openings $52_A$ and $52_B$ are located so as to expose bonding pads 72 of the bonding surface 24 of the IC die. The operation 84 can be performed in various ways, such as by photolithographically controlled etching of the die solder resist 62 or using laser drilling. The operation 84 includes a suitable modification 86, depending on how it is performed, to form the die solder resist openings $52_A$ and $52_B$ of different sizes (with solder resist openings $52_A$ of Region A being larger than solder resist openings $52_B$ of Region B). For example, if the operation 84 employs photolithographically controlled etching then the modification 86 may use a modified photomask during photolithographic exposure of a photoresist coated onto the die solder resist 62 produces a latent image yielding the appropriately sized openings during subsequent development of the exposed photoresist. (Note that the photomask is not modified during the operation 84. Rather, the photomask is a modified photomask compared with a photomask designed to from resist openings 52 which are all of the same size. The use of the modified photomask 86 in the operation 84 therefore has the effect of forming the die solder resist openings $52_A$ and $52_B$ in respective Region A and Region B which are of different sizes.) As another example, if computer-controlled laser drilling (e.g., with computer control of an X-Y translation stage on which the IC die is mounted and computer-controlled focal size of the drilling laser beam) is used in the operation 84 then the modification 86 suitably includes using a laser drilling program that is suitably modified to drill larger die solder resist openings $52_A$ in the Region A as compared with the other die solder resist openings $52_B$, e.g. by using a larger-diameter laser beam for drilling the larger die solder resist openings $52_A$.

In an operation 88, the substrate solder resist openings 54 are formed in the substrate solder resist 64. As previously described, these substrate solder resist openings 54 are located so as to expose bonding pads 74 of the bonding surface 26 of the substrate. As with the operation 84, the operation 88 can be performed in various ways, such as by photolithographically controlled etching of the substrate solder resist 64 or using laser drilling.

The bonding of the IC die and the substrate via the BGA then follows. In an operation 90, the BGA (ball grid array) is assembled between the IC die and the substrate, with each bonding ball being positioned between a die solder resist opening $52_A$ or $52_B$ and an aligned substrate solder resist opening 54. In an operation 92, a solder reflow process is performed to cause the solder of the bonding balls to partially melt or at least become flowable so as to reflow into the shape shown in FIGS. 3 and 4. In one nonlimiting illustrative example, the solder reflow process 92 entails heating the BGA to a temperature of around 240° C. to 260° C., although the optimal heating temperature and time will depend on the type of solder and possibly also the type of bonding ball (e.g. solder ball versus copper-core bonding ball with a solder coating).

To complete the semiconductor package assembly, in an operation 94 the underfill material 22 (see FIG. 1) is injected in the space between the bonding bumps $50_A$ and $50_B$ of the BGA, and in an operation 96 the underfill material is cured, for example at a temperature of 100-180° C. in one nonlimiting illustrative embodiment. In an operation 98, the thermal interface material 48 is applied on top of the IC die (or dies if the semiconductor package includes multiple dies as shown in FIGS. 1 and 2) and the lid 46 (and supporting/sealing ring 44) is installed.

The foregoing packaging process described with reference to FIG. 8 is merely a nonlimiting illustrative example, and numerous variants are contemplated.

In the following, some further embodiments are described.

In a nonlimiting illustrative embodiment, a semiconductor package includes a substrate and at least one integrated circuit (IC) die. The substrate has a substrate dielectric layer disposed on a bonding surface of the substrate. The substrate dielectric layer has substrate dielectric layer openings exposing substrate bonding pads of the bonding surface of the substrate. The IC die has a die dielectric layer disposed on a bonding surface of the IC die arranged facing the bonding surface of the substrate. The die dielectric layer has die dielectric layer openings exposing die bonding pads of the bonding surface of the IC die. A ball grid array comprising conductive bonding bumps electrically connects the die bonding pads with substrate bonding pads via the die dielectric layer openings and the substrate dielectric layer openings. The die dielectric layer openings include a subset A of the die dielectric layer openings in a region A of the bonding surface of the IC die and a subset B of the die dielectric layer openings in a region B of the bonding surface of the IC die. The die dielectric layer openings of subset A are larger than the die dielectric layer openings of the subset B.

In a nonlimiting illustrative embodiment, a semiconductor package assembly method includes: forming a substrate solder resist on a bonding surface of a substrate; forming a die solder resist on a bonding surface of at least one IC die; forming substrate solder resist openings in the substrate solder resist exposing substrate bonding pads of the bonding surface of the substrate; forming die solder resist openings in the die solder resist exposing die bonding pads of the bonding surface of the IC die, wherein the die solder resist openings formed in at least one peripheral region of the bonding surface of the IC die are larger than the other die solder resist openings formed in the die solder resist; and electrically connecting the IC die with the substrate using a ball grid array comprising conductive bonding bumps electrically connecting the die bonding pads with substrate bonding pads via the die solder resist openings and the substrate solder resist openings.

In a nonlimiting illustrative embodiment, a semiconductor package is disclosed, including a substrate with a substrate dielectric layer on a bonding surface of the substrate, an IC die with a die dielectric layer on a bonding surface of the IC die, and a ball grid array. The substrate dielectric layer has substrate dielectric layer openings exposing substrate bonding pads of the bonding surface of the substrate. The die dielectric layer has die dielectric layer openings exposing die bonding pads of the bonding surface of the IC die. The ball grid array comprises conductive bonding bumps electrically connecting the die bonding pads with substrate bonding pads via the die dielectric layer openings and the substrate dielectric layer openings. The die dielectric layer openings at two or more corners of the IC die are larger than the other die dielectric layer openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
a substrate having a substrate dielectric layer disposed on a bonding surface of the substrate wherein the substrate dielectric layer has substrate dielectric layer openings exposing substrate bonding pads of the bonding surface of the substrate;
at least one integrated circuit (IC) die having a die dielectric layer disposed on a bonding surface of the IC die arranged facing the bonding surface of the substrate wherein the die dielectric layer has die dielectric layer openings exposing die bonding pads of the bonding surface of the IC die; and
a ball grid array comprising conductive bonding bumps electrically connecting the die bonding pads with substrate bonding pads via the die dielectric layer openings and the substrate dielectric layer openings;
wherein the die dielectric layer openings include a subset A of the die dielectric layer openings in a region A of the bonding surface of the IC die and a subset B of the die dielectric layer openings in a region B of the bonding surface of the IC die, and
wherein the die dielectric layer openings of subset A are larger than the die dielectric layer openings of the subset B.

2. The semiconductor package of claim 1 wherein a ratio of a diameter of the die dielectric layer openings of subset A to a diameter of the substrate dielectric layer openings is at least 0.7.

3. The semiconductor package of claim 1 wherein $A_{SRO\text{-}A}/A_{SRO\text{-}SBT} \geq 0.5$ where $A_{SRO\text{-}A}$ is the cross-sectional area of the die dielectric layer openings of subset A and $D_{SRO\text{-}SBT}$ is the cross-sectional area of the substrate dielectric layer openings.

4. The semiconductor package of claim 1 wherein:
the region A of the bonding surface of the IC die includes at least one peripheral region of the bonding surface of the IC die.

5. The semiconductor package of claim 1 wherein:
the bonding surface of the IC die has a rectangular area;
the region A of the bonding surface of the IC die includes at least two corner regions of the bonding surface of the IC die; and $$\frac{L2}{L1} \geq 0.15$$

where L1 is a length of a side of the rectangular area of the bonding surface of the IC die and L2 is a length of the corner regions along the same side of the rectangular area of the bonding surface of the IC die as L1.

6. The semiconductor package of claim 5 wherein:
the conductive bonding bumps of the ball grid array electrically connecting die bonding pads with substrate bonding pads via the die dielectric layer openings of subset A have a height H2; and
the conductive bonding bumps of the ball grid array electrically connecting die bonding pads with substrate bonding pads via the die dielectric layer openings of subset B have a height H1, where height H1 is larger than height H2.

7. The semiconductor package of claim 1 wherein:
the conductive bonding bumps of the ball grid array electrically connecting die bonding pads with substrate bonding pads via the die dielectric layer openings of subset A have a first shape; and
the conductive bonding bumps of the ball grid array electrically connecting die bonding pads with substrate bonding pads via the die dielectric layer openings of subset B have a second shape that is different from the first shape.

8. The semiconductor package of claim 1 wherein the at least one IC die includes at least one dynamic random access memory (DRAM) die and the semiconductor package further includes:

a ring encircling the at least one DRAM die; and
a lid disposed on the ring and on the at least one DRAM die.

9. The semiconductor package of claim 1 wherein the die dielectric layer openings correspond with substrate dielectric layer openings.

10. A semiconductor package assembly method comprising:
   forming a substrate solder resist on a bonding surface of a substrate;
   forming a die solder resist on a bonding surface of at least one integrated circuit (IC) die;
   forming substrate solder resist openings in the substrate solder resist exposing substrate bonding pads of the bonding surface of the substrate;
   forming die solder resist openings in the die solder resist exposing die bonding pads of the bonding surface of the IC die, wherein the die solder resist openings formed in at least one peripheral region of the bonding surface of the IC die are larger than the other die solder resist openings formed in the die solder resist; and
   electrically connecting the IC die with the substrate using a ball grid array comprising conductive bonding bumps electrically connecting the die bonding pads with substrate bonding pads via the die solder resist openings and the substrate solder resist openings.

11. The semiconductor package assembly method of claim 10 wherein a ratio of a diameter of the die solder resist openings in the at least one peripheral region to a diameter of the substrate solder resist openings is at least 0.7.

12. The semiconductor package assembly method of claim 10 wherein $$\frac{A_{SRO-A}}{A_{SRO-SBT}} \geq 0.5$$

where $A_{SRO-A}$ is the cross-sectional area of the die solder resist openings in the at least one peripheral region and $D_{SRO-SBT}$ is the cross-sectional area of the substrate solder resist openings.

13. The semiconductor package assembly method of claim 10 wherein:
   the bonding surface of the IC die has a rectangular area;
   the at least one peripheral region of the bonding surface of the IC die in which the die bonding resist openings are larger than the other die solder resist openings formed in the die solder resist includes at least two corner regions of the bonding surface of the IC die; and $$\frac{L2}{L1} \geq 0.15$$

where L1 is a length of a side of the rectangular area of the bonding surface of the IC die and L2 is a length of the corner regions along the same side of the rectangular area of the bonding surface of the IC die as L1.

14. The semiconductor package assembly method of claim 10 wherein the conductive bonding bumps of the ball grid array electrically connecting die bonding pads with substrate bonding pads via the die solder resist openings in the at least one peripheral region have a height that is less than a height of the conductive bonding bumps of the ball grid array electrically connecting die bonding pads with substrate bonding pads via the other die solder resist openings formed in the die solder resist.

15. The semiconductor package assembly method of claim 10 wherein the conductive bonding bumps of the ball grid array electrically connecting die bonding pads with substrate bonding pads via the die solder resist openings in the at least one peripheral region have a different shape than the conductive bonding bumps of the ball grid array electrically connecting die bonding pads with substrate bonding pads via the other die solder resist openings formed in the die solder resist.

16. The semiconductor package assembly method of claim 10 wherein the at least one IC die includes at least one dynamic random access memory (DRAM) die and the semiconductor package assembly method further includes:
   disposing a ring encircling the at least one DRAM die;
   applying thermal interface material on the at least one DRAM die; and
   disposing a lid on the ring and on the thermal interface material on the at least one DRAM die.

17. The semiconductor package assembly method of claim 10 further comprising:
   electrically connecting a logic IC die with the bonding surface of the substrate by a logic IC die ball grid array;
   wherein the ring further encircles the logic IC die, the thermal interface material is further applied on the logic IC die, and the lid is also disposed on the thermal interface material on the logic IC die.

18. A semiconductor package comprising:
   a substrate with a substrate dielectric layer on a bonding surface of the substrate, the substrate dielectric layer having substrate dielectric layer openings exposing substrate bonding pads of the bonding surface of the substrate;
   an integrated circuit (IC) die with a die dielectric layer on a bonding surface of the IC die, the die dielectric layer having die dielectric layer openings exposing die bonding pads of the bonding surface of the IC die; and
   a ball grid array comprising conductive bonding bumps electrically connecting the die bonding pads with substrate bonding pads via the die dielectric layer openings and the substrate dielectric layer openings;
   wherein the die dielectric layer openings at two or more corners of the IC die are larger than the other die dielectric layer openings.

19. The semiconductor package of claim 18 wherein a shape of the conductive bonding bumps at the two or more corners of the IC die are different from a shape of the other conductive bonding bumps of the ball grid array.

20. The semiconductor package of claim 19 wherein a ratio of a diameter of the die dielectric layer openings at the two or more corners of the IC die to a diameter of the substrate dielectric layer openings is at least 0.7.

* * * * *